United States Patent [19]

Ozguc

[11] Patent Number: 5,502,746
[45] Date of Patent: Mar. 26, 1996

[54] DUAL STAGE DIFFERENTIAL ADAPTIVE PEAK DETECTOR FOR DATA COMMUNICATIONS RECEIVERS

[75] Inventor: Ismail H. Ozguc, Sunnyvale, Calif.

[73] Assignee: Exar Corporation, San Jose, Calif.

[21] Appl. No.: 243,624

[22] Filed: May 16, 1994

[51] Int. Cl.[6] .......................... H04L 25/06; H04L 25/10
[52] U.S. Cl. ................................. 375/317; 327/51
[58] Field of Search ..................... 375/76; 307/350, 307/358, 359, 540, 264; 328/146, 149, 150, 168, 175

[56] References Cited

U.S. PATENT DOCUMENTS

| | | | |
|---|---|---|---|
| 4,449,061 | 5/1984 | Yasuda et al. | 375/76 |
| 4,475,210 | 10/1984 | Couch | 375/76 |
| 5,134,632 | 7/1992 | Fletcher et al. | 375/76 |

Primary Examiner—Stephen Chin
Assistant Examiner—Don N. Vo
Attorney, Agent, or Firm—Townsend and Townsend and Crew

[57] ABSTRACT

A dual stage adaptive peak detect circuit includes a fast peak detector that detects the trends in the magnitude of the incoming signal and an adaptable peak detector that accurately follows the peak of the signal. A difference circuit detects the voltage difference between the outputs of the fast peak detector and the adaptable peak detector. A voltage-to-current converter feeds back the current-converted difference voltage to the adaptable peak detector to adjust its peak detection charge current. The dual stage adaptive peak detector of the present invention is thus capable of accurately following the peak of an incoming signal with varying amplitudes.

21 Claims, 4 Drawing Sheets

DUAL STAGE DIFFERENTIAL ADAPTIVE PEAK DETECTOR FOR DATA COMMUNICATIONS RECEIVERS

BACKGROUND OF THE INVENTION

This invention relates in general to data communications circuits, and in particular to an adaptive peak detector for data communications receivers.

In baseband digital communication systems, information is typically encoded in a series of pulses that are transmitted over the communication channel. The pulse stream of logical zeros and ones are detected at the receiver end to regenerate the information. For error free regeneration of the transmitted signal, the receiver must accurately detect the logic levels of the received signal. To establish the threshold voltage between a logical one and a logical zero, receivers typically first apply the incoming signal to a peak detect circuit. The peak detect circuit provides a DC reference corresponding to the peak value of the input signal. The peak value is then divided to produce threshold levels at, for example, 50% of the detected peak value. Comparators are then used to recover the pulses by slicing the input signal around the threshold levels.

Most peak detect circuits acquire the peak of an input signal by first rectifying it and then allowing the rectified signal to charge or discharge a capacitor. A typical example of a positive peak detect circuit is shown in FIG. 1. A comparator 100 receives the input signal Vin at its positive input. The negative input of comparator 100 connects to the output of the circuit Vpk, a capacitor 102 and the source terminal of an N-channel MOS transistor 104. The output of comparator 100 drives the gate terminal of transistor 104, whose drain connects to a supply voltage. In operation, assume that capacitor 102 is initially discharged such that Vpk and the negative input of comparator 100 are at ground. As the input signal Vin rises above ground, the output of comparator 100 goes high, turning on transistor 104. Transistor 104 acts as a source-follower and charges capacitor 102, thereby raising the output voltage Vpk. This voltage is fed back to the negative input of the comparator. Thus, as long as the input signal Vin continues to rise, capacitor 102 is charged through transistor 104. When the signal Vin reaches its peak value, transistor 104 stops charging capacitor 102, and Vpk is held at the peak value minus the threshold voltage for transistor 104. Capacitor 102 will be incrementally charged every time the signal at Vin rises above the preceding peak value. Thus, the circuit provides at the output Vpk, a DC voltage representing the peak value of the input signal Vin.

circuit speed and dynamic range are among the most important factors in the design of a peak detect circuit. The peak of the input signal must be acquired as early as possible so that the receiver can start detecting the signal. A very fast peak detector can detect the peak of the incoming signal after the reception of a few pulses. Typical system specifications require the acquisition of the peak within about 20 clock cycles. The speed of the circuit is primarily governed by the input signal amplitude and the charge current for a given peak detection capacitor size. That is, the peak detection capacitor must be charged faster to reach a larger peak value within the same time period. This is accomplished by adjusting the charge transistor size which in turn adjusts the charge current to the capacitor. Input signal amplitude also governs the dynamic range performance of the circuit.

Typical CMOS or bipolar comparators have a fixed dynamic range. Their design centers the window of operation at either high input voltages or low input voltages. Signal distortion and output offset occurs if a signal outside the dynamic range of the comparator is applied to its inputs.

Because of the above considerations, the design of peak detect circuits is typically optimized for either small or large input signals. This, however, creates problems when there are large amplitude variations in the input signal. Variations in the length of the communication line cause variations in signal amplitude. As a result, peak values for the transmitted signal may vary significantly depending on the channel length. Another drawback of the above peak detect circuit is that due to temperature dependence of the charge current, the speed of the circuit varies with changes in temperature conditions. Also, because of the use of the source-follower, the peak detector output is always one threshold voltage below the actual peak of the input signal. The limited dynamic range and temperature dependence of the peak detect circuit give rise to large offsets and reduce the accuracy of peak detection. Peak detection offset results in non-optimum slicing levels for the comparators inside the receiver. This in turn increases the probability of bit errors.

There is therefore a need for an accurate peak detect circuit that enjoys a wide dynamic range for use in data communication systems.

SUMMARY OF THE INVENTION

The present invention provides a dual stage, wide dynamic range adaptive peak detect circuit that accurately detects the peak values of an input signal.

The peak detector of the present invention includes two stages, a fast peak detector that is followed by an adaptable peak detector stage. Broadly, the fast peak detector detects trends in amplitude variations of the incoming signal at a faster rate than the adaptable peak detector. This information is then fed to the adaptable peak detector that adjusts the charge current of the peak detection capacitor accordingly. Thus, by continuously monitoring the difference between the peak value at the output of the circuit and the trends in the amplitude variations of the input signal, the peak detector of the present invention is capable of adjusting its dynamic performance.

In one embodiment, the present invention provides a peak detect circuit that includes: a first peak detector having an input for receipt of an input signal and an output; a second adaptable peak detector having an input for receipt of the input signal and an output; means connected to the outputs of the two peak detectors, for detecting the difference between the two output signals and generating a difference signal; and feedback means connected between the detecting means and the second adaptable peak detector for adjusting the amount of a charge current in the second adaptable peak detector in response to the difference signal.

A better understanding of the nature and advantages of the adaptive peak detector of the present invention may be had with reference to the detailed description and diagrams below.

DESCRIPTION OF THE PREFERRED EMBODIMENT

Figure 2:
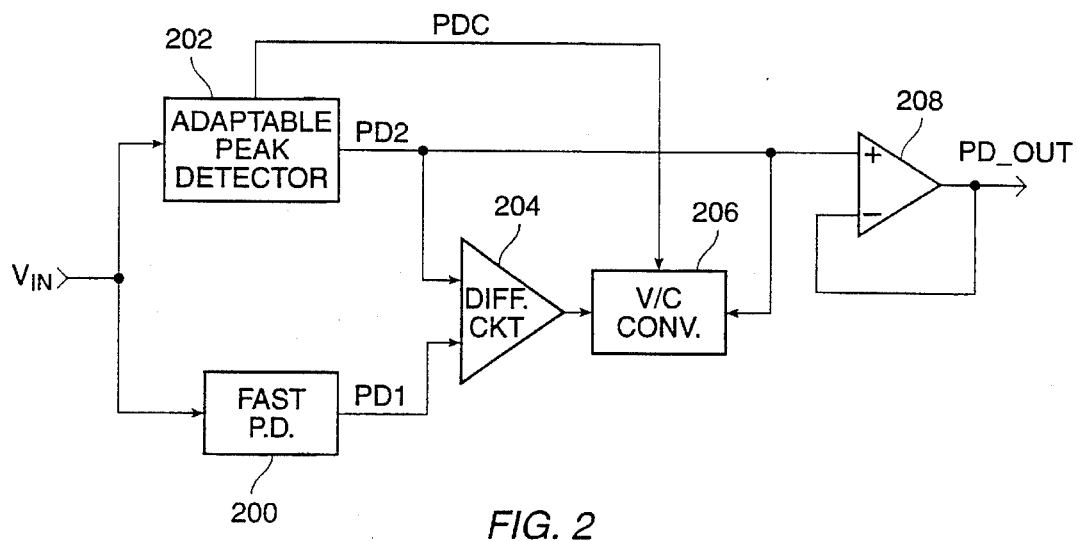
FIG. 2 is a block diagram of the dual stage adaptive peak detect circuit according to the present invention.

FIG. 2 is a block diagram of the dual stage adaptive peak detect circuit according to the present invention. A fast peak detector 200 receives an input signal Vin at its input. The input signal is also applied to an input of a second adaptable peak detector 202. Fast peak detector 200 is designed with a large charge current and a small capacitor so that it coarsely follows the peak of the input signal Vin at a fast rate. Adaptable peak detector 202 is designed with a smaller charge current and a relatively large capacitor, and therefore follows the peak of the small input signals more accurately. Adaptable peak detector 202 is, however, initially considerably slower than coarse peak detector 200. Given an input signal Vin with a large amplitude, the output PD1 of coarse peak detector 200 approaches the peak value at a much faster rate than the output PD2 of adaptable peak detector 202. A difference voltage thus develops across the outputs of the two peak detectors. The outputs of the two peak detectors feed into a difference circuit 204 that detects the difference between the two signals PD1 and PD2 and generates a difference voltage at its output. The output of difference circuit 204 connects to an input of a voltage-to-current converter 206 that converts the difference voltage into current at its output. This difference current is fed back to adaptable peak detector 202 and adds to the charge current to speed up the detector operation. A non-inverting, unity gain connected amplifier 200 buffers output PD2 of adaptable peak detector 200 to provide the circuit output PD_OUT.

Figure 1:
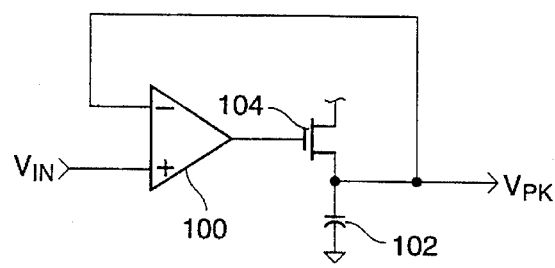
FIG. 1 is a circuit schematic of a typical prior art positive peak detect circuit.
Figure 3A:
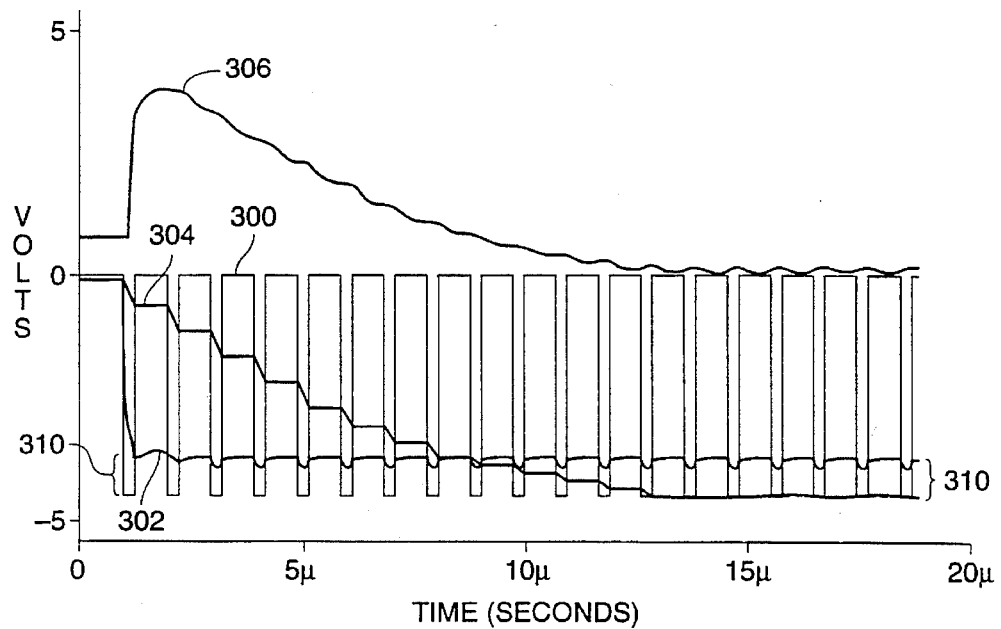
FIGS. 3A and 3B are timing diagrams illustrating the operation of the adaptive peak detect circuit of the present invention.
Figure 3B:
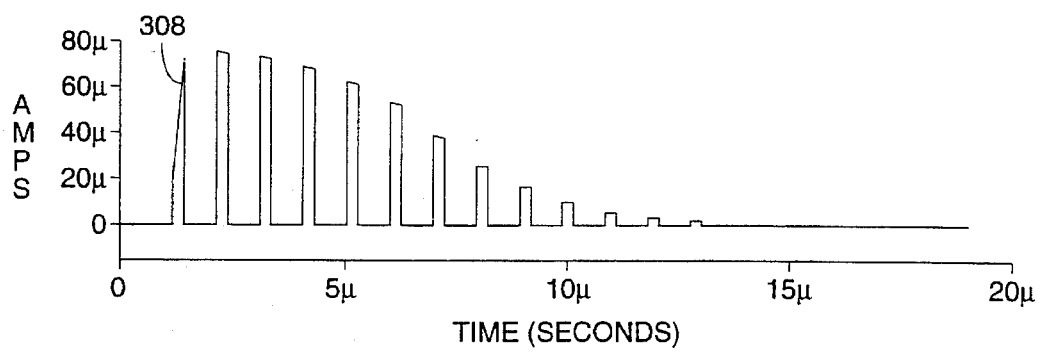

Peak detect circuits can be designed to detect either a negative peak or a positive peak. The embodiment described herein uses negative peak detection. It is to be understood, however, that the principals of this invention can be directly applied to circuits based on positive peak detection as well. The operation of the dual stage adaptive peak detector of the present invention will be described in connection with the timing diagrams shown in FIGS. 3A and 3B. FIG. 3A shows an input signal 300, a signal 302 at output PD1 of coarse peak detector 200, a signal 304 at output PD2 of adaptable peak detector 202, and the difference signal 306. Input signal 300 is a series of narrow negative pulses between 0 and about −4.5 volts. As can be seen from signal 302, the first negative pulse causes output PD1 of coarse peak detector 200 to rapidly fall toward the negative peak. Output PD2 of adaptable peak detector 202, however, moves only slightly down toward the negative peak as shown by signal 304. Difference signal 306 shows the magnitude of the difference between the two outputs (i.e., signals 302 and 304). Referring to FIG. 3B, the difference voltage is converted to a pulse of current (approximately 75 μA in this example), as shown by signal 308. This current is injected into main peak detector 202 to increase the capacitor charge rate to speed up peak detection. Thus, when the next pulse arrives, signal 304 at output PD2 of adaptable peak detector 200 drops faster down towards the negative peak, reducing the difference signal. This process continues through subsequent pulses as long as a difference signal exists. The decrease in the difference voltage is indicated by both, signal 306 and the feedback injection current signal 308. Because coarse peak detector 200 uses a source-follower transistor similar to the circuit of FIG. 1, it's output signal 302 exhibits an offset voltage 310 of about one threshold voltage. The output of adaptable peak detector 202, however, reaches the full peak value. This will be explained in greater detail in connection with FIG. 5 which shows the circuitry of main peak detector 202.

Figure 4:
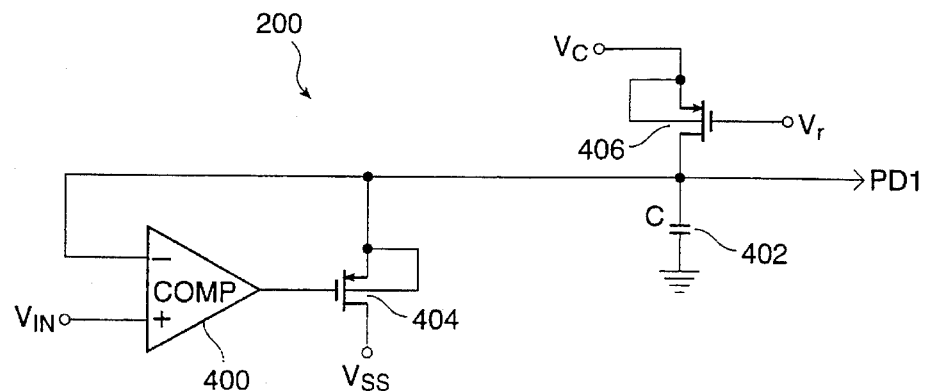
FIG. 4 is a circuit schematic of a fast negative peak detector used in the circuit of the present invention.

FIG. 4 is a circuit schematic of coarse negative peak detector 200. The circuit includes a comparator 400 that receives the input signal Vin at its positive input. The negative input of comparator 400 connects to the circuit output PD1, top plate of a capacitor 402 and the source terminal of a P-channel transistor 404. The gate terminal of transistor 404 connects to comparator 400 output, and its drain connects to the negative power supply VSS. A transistor 406 connects the circuit output PD1 to a clamp voltage Vc. The operation of this peak detector is very similar to the prior art peak detector shown in FIG. 1. Transistor 404 turns on when an input signal goes below the voltage level at the output PD1. Capacitor 402 is discharged toward VSS via transistor 404 as long as the input remains lower than the output PD1. The size of transistor 404 is adjusted such that when turned on it conducts large currents. Thus, peak detector 200 acquires the peak of the input signal very rapidly. This circuit, however, suffers from the same drawbacks as the prior art peak detectors. Due to the large discharge currents, the circuit tends to overshoot and is therefore not very accurate for input signals with smaller magnitudes. The performance of this circuit is also very process and temperature dependent. The amount of discharge current and therefore the circuit speed changes significantly as the performance characteristics of transistor 404 varies with temperature and process variations.

Because the dual stage peak detect circuit of the present invention is to operate accurately with small input signals, it is critical to reduce circuit susceptibility to noise. By connecting the source terminal of transistor 406 to a clamp voltage Vc, the possibility of detecting noise as valid data is eliminated. The gate terminal of transistor 406 connects to a reference voltage Vr. This transistor is on at all times and bleeds a minute amount of charge into capacitor 402 constantly. Thus, in the absence of an input signal, capacitor 402 is allowed to charge up to the clamp voltage level Vc. For negative peak detection, the clamp voltage level Vc may be set at, for example, −0.1 to −0.3 volts. Thus, in the absence of an input signal, any noise signal within the range of the clamp voltage will not be erroneously detected as valid input signal. Without clamping, capacitor 402 would be fully charged to ground, which would give rise to false detection of an input signal in the presence of cross-talk noise or interference.

Figure 5:
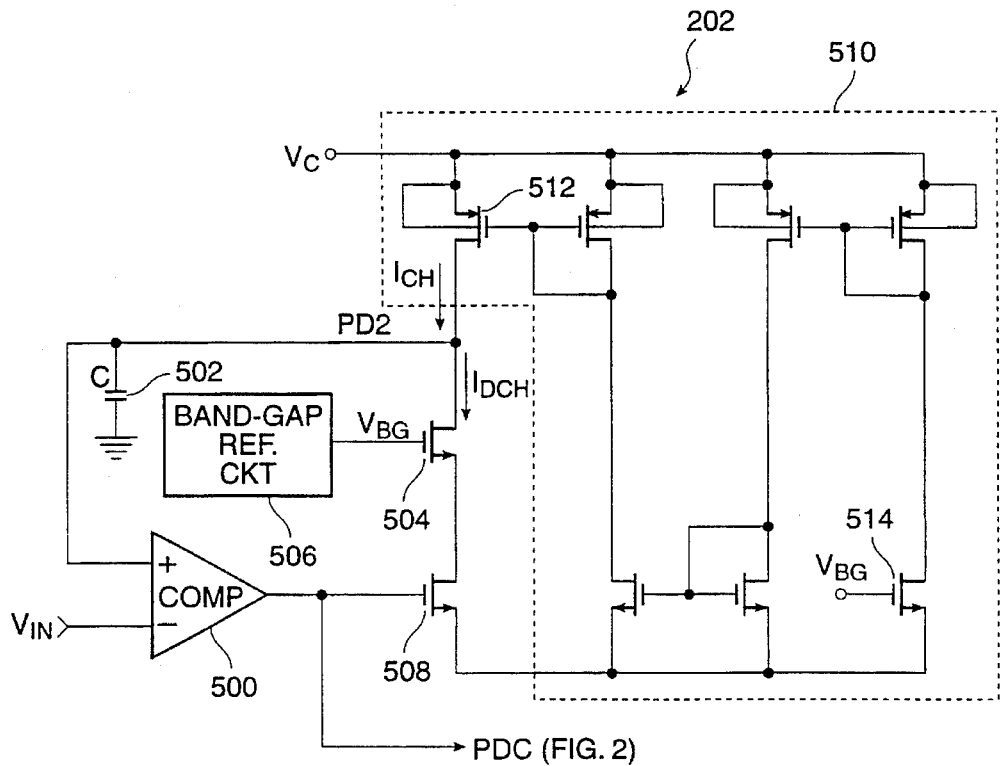
FIG. 5 is a circuit schematic of an adaptable negative peak detector according to one embodiment of the present invention.

FIG. 5 is a circuit schematic of adaptable negative peak detector 202. A comparator 500 receives the input signal Vin at its negative input. Comparator 500 is designed with P-channel input transistors to handle input common mode voltages from 0 down to −4.5 volts. The positive input connects to the circuit output PD2, a capacitor 502, and the drain terminal of an N-channel reference current transistor 504. The gate of transistor 504 connects to the output $V_{BG}$ of a band-gap current reference circuit 506. The source terminal of transistor 504 connects to the drain terminal of an N-channel transistor 508, whose gate is driven by the output of comparator 500. The source terminal of transistor 508 connects to the negative supply voltage VSS. A current mirroring network 510 driven by the band-gap reference output $V_{BG}$, and connected between the negative power supply VSS and the clamp voltage Vc, connects to the output PD2. This circuit is designed to detect the peak much more accurately compared to coarse peak detector 200. However, it is much slower in operation. The accuracy is achieved by using a much smaller current to negatively charge a much larger capacitor. There may be at least an order of magnitude difference in the amount of current and the size of capacitor between the two peak detectors. The discharge current $I_{dch}$ is set by the size of reference transistor 504. When a negative pulse arrives at the negative input of comparator 500, the comparator output goes high, turning on transistor 508. This creates a conductive path between the output node PD2 and the negative supply VSS through transistors 504 and 508. Capacitor 502 is thus discharged towards VSS by an amount of current $I_{dch}$ set by the gate to source voltage of reference transistor 504. As described in connection with the block diagram of FIG. 2, the output of voltage-to-current converter 206 also feeds into node PD2. Thus, the total amount of discharge current is increased by the current-converted difference voltage. That is, as long as there is a difference in peak detector output signals, charge is removed from capacitor 502 not only by transistors 504 and 508, but also by a current-sink in voltage-to-current converter 206. This will be described hereinafter in more detail in connection with FIG. 7.

The function of the current mirroring network 510 is to slowly charge capacitor 502 back up to the clamp voltage Vc in the absence of an input signal. Similar to the clamp circuit of FIG. 4 (transistor 406), this will reduce the possibility of an erroneous detection of cross-talk noise or interference as valid input data. When the input signal is removed, transistor 508 turns off, allowing transistor 512 inside current mirroring network 510 to charge capacitor 502 toward Vc. The amount of this charge current $I_{ch}$ is also set by the band-gap reference output $V_{BG}$ which connects to the gate terminal of transistor 514. However, current mirroring network 510 is designed such that the reference current generated by transistor 514 is divided down by a large number to obtain a very small charge current $I_{ch}$ at the drain terminal of transistor 512. The exemplary transistor sizes shown in FIG. 5 yields a charge current $I_{ch}$ of approximately 54 times smaller than the discharge current $I_{dch}$.

In addition to the fact that the peak detector of FIG. 5 is capable of following the peak of the input signal more accurately, there are several other advantages to the design of this circuit. The use of band-gap reference circuit 506 to set the charge and discharge currents provides a much more stable temperature performance. The charge/discharge rate of capacitor 502 thus does not vary as much with process and temperature variations. Furthermore, by reversing the polarity of the inputs to comparator 500, this circuit uses an N-channel instead of a P-channel transistor at the output of comparator 500. When transistor 508 is turned on, the voltage at the drain terminal of transistor 508 drops very near VSS. Thus, the body effect on reference transistor 504 is minimized. This in turn increases the dynamic range of the circuit by allowing capacitor 502 to be discharged to very near VSS. As a result this circuit does not suffer from an offset of one threshold voltage at its output.

Figure 6:
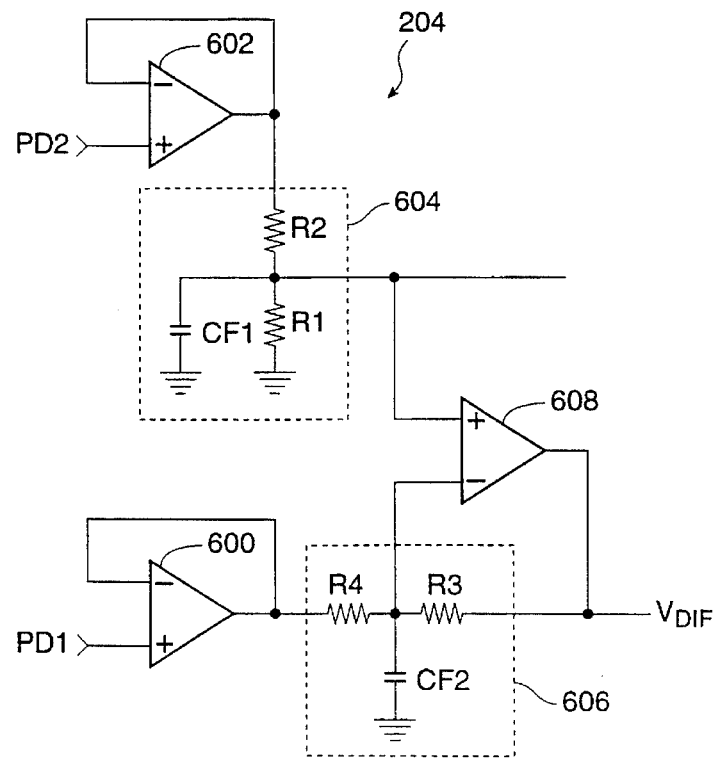
FIG. 6 is a schematic of a difference circuit used in the circuit of the present invention.

FIG. 6 is an exemplary circuit schematic for difference circuit 204. Each of the outputs of the two peak detectors PD1 and PD2 is buffered using a unity gain connected operational amplifier 600 and 602, respectively. This prevents the peak detection capacitors at the output of the peak detector circuits to be inadvertently discharged by the subsequent stage. A summing amplifier 608 receives the buffered outputs of the two peak detectors at its inputs through resistor-capacitor networks 604 and 606. The output of amplifier 608 provides the difference voltage $V_{dif}$ between PD1 and PD2.

Figure 7:
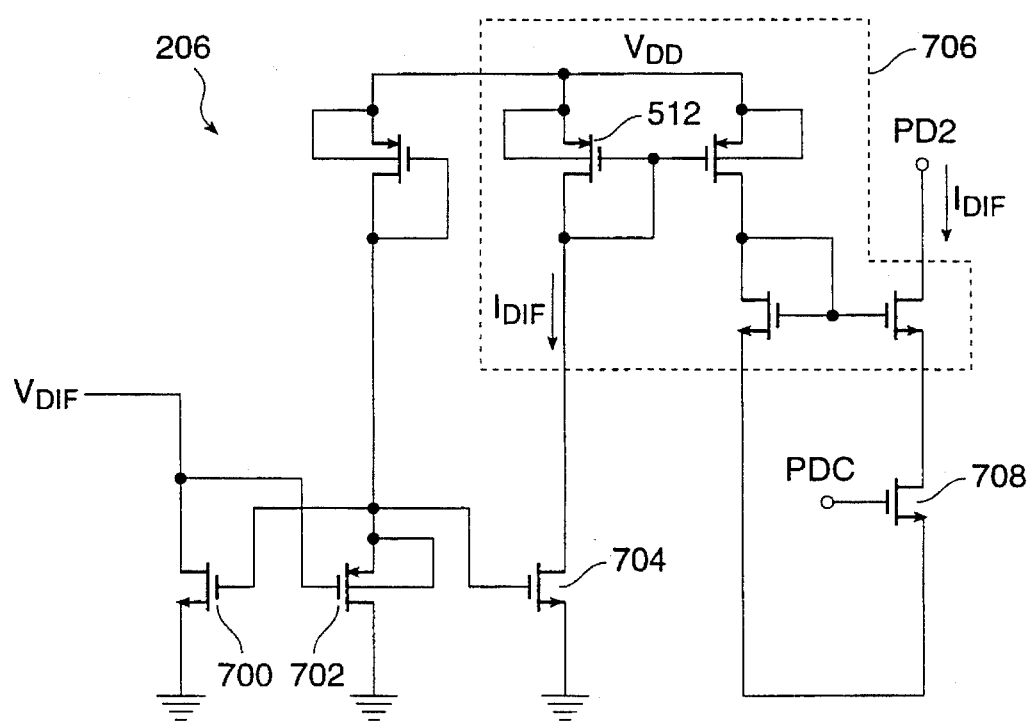
FIG. 7 is a circuit schematic of a voltage to current converter used in the peak detect circuit of the present invention.

FIG. 7 is an exemplary circuit schematic for voltage-to-current converter 206. Transistors 700, 702 and 704 act as an active linear resistor that turns the voltage at the output of difference circuit 204 to a current $I_{dif}$. A current mirroring network 706 mirrors and feedsback $I_{dif}$ to output PD2 of peak detector 202. A transistor 708 acts a switch to create a conductive path when turned on, operating similar to transistor 508 in FIG. 5. The output of comparator 500 in peak detector 202 (FIG. 5) connects to the gate terminal of transistor 708. Thus, $I_{dif}$ flows to remove charge from capacitor 502 only when transistor 708 is turned on.

In conclusion, the present invention provides a dual stage adaptive peak detect circuit that accurately follows the peak of an incoming signal at large as well as small magnitudes. In one embodiment, the circuit includes a fast but coarse peak detector to detect the trends in input signal amplitude, and a slow but accurate second peak detector that closely follows the peak of the signal. A difference circuit extracts the voltage difference between the two peak detect outputs and feeds back a corresponding differential current to the second peak detector. The speed of operation for the second peak detector is initially increased due to the differential current. As the difference voltage decreases gradually, the amount of the feedback differential current also decreases.

While the above is a complete description of a specific embodiment of the present invention, it is possible to use various alternatives, modifications and equivalents. For example, by reversing the polarities of the transistor types, power supply connections and comparator inputs, this circuit can be used to detect positive peaks. Therefore, the scope of the present invention should be determined not with reference to the above description but should, instead, be determined with reference to the appended claims, along with their full scope of equivalents.

What is claimed is:

1. A peak detect circuit for use in communication receivers comprising:

a first peak detector having an input for receipt of an input signal, the first peak detector detecting a peak value of the input signal at a first rate of detection;

a second adaptable peak detector having an input for receipt of the input signal, the second adaptable peak detector detecting a peak of the input signal at a variable rate of detection; and control circuit coupled between the first peak detector and the second adaptable peak detector for adjusting the variable rate of detection for the second adaptable peak detector in response to an output of the first peak detector and an output of the second adaptable peak detector.

2. The peak detect circuit of claim 1 wherein the control circuit further comprises:

a difference circuit coupled to the output of the first peak detector and the output of the second adaptable peak detector, for detecting a difference between the output of the first peak detector and the output of the second adaptable peak detector, and for generating a difference signal; and feedback circuit coupled between the difference circuit and the second adaptable peak detector for adjusting an amount of a charge current in the second adaptable peak detector in response to the difference signal.

3. The peak detect circuit of claim 2 wherein the first peak detector has a large fixed charge current for fast acquisition of a peak of the input signal.

4. The peak detect circuit of claim 3 wherein the second adaptable peak detector has a fixed charge current smaller than the charge current of the first peak detector.

5. The peak detect circuit of claim 4 wherein the second adaptable peak detector receives a supplemental charge current from the feedback circuit when there is a difference signal between the output of the first peak detector and the output of the second adaptable peak detector.

6. The peak detect circuit of claim 1 wherein the first peak detector further comprises a clamp circuit coupled to the output of the first peak detector, the clamp circuit for clamping the output of the first peak detector to a minimum voltage above or below a predefined noise level.

7. The peak detect circuit of claim 1 wherein the second adaptable peak detector further comprises a clamp circuit coupled to the output of the second adaptable peak detector, the clamp circuit for clamping the output of the second adaptable peak detector to a minimum voltage above or below a predefined noise level.

8. The peak detect circuit of claim 1 wherein the second adaptable peak detector uses a band-gap reference circuit to set a fixed peak detection charge current.

9. The peak detect circuit of claim 1 wherein said first peak detector comprises:

a comparator having a first input terminal coupled to the input signal, a second input terminal coupled to an output terminal of the first peak detector, and an output terminal;

a capacitor having a first terminal coupled to the second input terminal of the comparator and the output terminal of the first peak detector, and a second terminal coupled to a reference voltage; and a switch coupled between said first terminal of said capacitor and a discharge node, said switch having a control terminal coupled to the output terminal of said comparator, said switch discharging said capacitor when conductive.

10. The peak detect circuit of claim 1 wherein said second adaptable peak detector comprises:

a comparator having a first input terminal coupled to the input signal, a second input terminal coupled to an output terminal of the second adaptable peak detector, and an output terminal;

a capacitor coupled to the second input terminal of the comparator and the output terminal of the second adaptable peak detector;

a first switch coupling said output terminal of the second adaptable peak detector to a first node, the first switch having a control terminal coupled to a reference voltage; and a second switch coupling the first node to a discharge node, the second switch having a control terminal coupled to the output terminal of the comparator.

11. The peak detect circuit of claim 10 wherein the second adaptable peak detector further comprises a clamp circuit comprising a current mirror network coupled to the output terminal of the second adaptable peak detector, the current mirror network for charging or discharging the capacitor to a clamp voltage in the absence of an input signal.

12. The peak detect circuit of claim 2 wherein the feedback circuit is a voltage-to-current converter.

13. A peak detect circuit for use in communication receivers comprising:

a first peak detector having an input for receipt of an input signal and an output;

a second adaptable peak detector having an input for receipt of the input signal and an output;

means coupled to the output of the first peak detector and the output of the second adaptable peak detector, for detecting a difference between the output of the first peak detector and the output of the second adaptable peak detector, and for generating a difference signal; and feedback means coupled between the detecting means and the second adaptable peak detector for adjusting an amount of a charge current in the second adaptable peak detector in response to the difference signal.

14. A method for adaptive peak detection of an input signal comprising the steps of:

(a) applying the input signal to an input of a fast peak detector and an input of an adaptable peak detector;

(b) generating a first peak value of the input signal at an output of the fast peak detector at a faster rate than a second peak value of the input signal at an output of the adapatable peak detector;

(c) detecting a difference between the first peak value and the second peak value; and (d) adjusting an amount of peak detection charge current for the adaptable peak detector in response to a difference signal detected in step (c).

15. The method of claim 14 further comprising the step of:

(e) clamping a voltage level at the output of the fast peak detector to a minimum voltage above or below a predetermined noise level.

16. The method of claim 14 further comprising the step of:

(f) clamping a voltage level at the output of the adaptable peak detector to a minimum voltage above or below a predetermined noise level.

17. A peak detect circuit comprising:

a first peak detector comprising:
a first comparator having a first input terminal coupled to an input signal,
a first capacitor having a first terminal coupled to an output terminal of the first peak detector, and
a first switch coupling the first terminal of the first capacitor to a discharge node, said first switch having a control terminal coupled an output terminal of the first comparator, the first switch for charging or discharging the first capacitor,
wherein, a peak value of the input signal is obtained at a first rate at the output terminal of the first peak detector;

a second adaptable peak detector comprising:
a second comparator having a first input terminal coupled to the input signal,
a second capacitor having a first terminal coupled to an output terminal of the second adaptable peak detector, and
a second switch coupling the first terminal of said second capacitor to a discharging node, said second switch having a control terminal coupled to an output terminal of the second comparator, wherein, a peak value of the input signal is obtained at a variable rate at the output terminal of the second adaptable peak detector; and a difference circuit coupled to the output terminal of the first peak detector and the output terminal of the second adaptable peak detector, the difference circuit generating a difference signal at an output terminal representing the difference between a signal at the output terminal of the first peak detector and a signal at the output terminal of the second peak detector, wherein, the difference signal adjusts the variable rate of peak detection by causing the charging or discharging of the second capacitor in the second adaptable peak detector.

18. The peak detect circuit of claim 17 wherein the difference circuit generates a voltage difference signal and wherein the peak detect circuit further comprises a voltage to current converter coupled to the output terminal of the difference circuit for converting the voltage difference signal to a current difference signal, the current difference signal charging or discharging the second capacitor in the second adaptable peak detector.

19. The peak detect circuit of claim 17 wherein the second adaptable peak detector further comprises a third switch coupled between the second switch and the second capacitor, the third switch being controlled by a reference voltage.

20. The peak detect circuit of claim 19 wherein the first peak detector further comprises a clamp circuit coupled to the output terminal of the first peak detector, the clamp circuit for clamping a signal at the output terminal of the first peak detector to a minimum voltage above or below a predefined noise level.

21. The peak detect circuit of claim 17 wherein the second adaptable peak detector further comprises a clamp circuit coupled to the output terminal of the second adaptable peak detector, the clamp circuit for clamping a signal at the output of the second peak detector to a minimum voltage above or below a predefined noise level.

\* \* \* \* \*